United States Patent [19]
Manley

[11] Patent Number: 5,284,784
[45] Date of Patent: Feb. 8, 1994

[54] BURIED BIT-LINE SOURCE-SIDE INJECTION FLASH MEMORY CELL

[75] Inventor: Martin H. Manley, San Jose, Calif.

[73] Assignee: National Semiconductor Corporation, Santa Clara, Calif.

[21] Appl. No.: 769,973

[22] Filed: Oct. 2, 1991

[51] Int. Cl.$^5$ .................. H01L 29/06; H01L 29/68; H01L 29/76; H01L 29/26

[52] U.S. Cl. ........................... 437/43; 437/49; 437/50

[58] Field of Search ............ 437/43, 48, 52, 919; 357/23.5; 365/185

[56] References Cited

U.S. PATENT DOCUMENTS

| | | | |
|---|---|---|---|
| 4,612,212 | 9/1986 | Masuoka et al. | 437/52 |
| 4,639,893 | 1/1987 | Eitan | 365/185 |
| 4,794,565 | 12/1988 | Wu et al. | 365/185 |
| 4,830,974 | 5/1989 | Chang et al. | 437/52 |
| 4,992,980 | 2/1991 | Park et al. | 365/164 |
| 5,045,485 | 9/1991 | Yeh | 437/43 |
| 5,053,841 | 10/1991 | Miyakawa et al. | 257/321 |
| 5,063,172 | 11/1991 | Manley | 437/43 |
| 5,108,939 | 4/1992 | Manley et al. | 437/978 |

FOREIGN PATENT DOCUMENTS

| | | | |
|---|---|---|---|
| A20335395 | 3/1989 | European Pat. Off. | H01L 29/78 |
| 0411573 | 2/1991 | European Pat. Off. | 365/185 |
| 1-212470 | 8/1989 | Japan | 437/40 |
| 3-174777 | 7/1991 | Japan | 437/52 |

OTHER PUBLICATIONS

K. Naruke, et al.; *A New Flash-Erase EEPROM Cell with a Sidewall Select-Gate on its Source Side;* IEEE 1989; IEDM 89 pp. 603–606.

A. T. Wu; *A Novel High-Speed, 5-volt programming EEPROM Structure with Source-Side Injection;* IEEE 1986; IEDM 86 pp. 584–587.

*Primary Examiner*—Olik Chaudhuri
*Assistant Examiner*—Richard A. Booth
*Attorney, Agent, or Firm*—Limbach & Limbach

[57] ABSTRACT

The present invention provides a flash EPROM cell structure that has the advantages of source-side injection, but which is formed in such a way as to allow it to be utilized in a virtual-ground buried bit-line array layout. The buried bit-line array confers two advantages over the more conventional T-cell array. It allows contacts to be shared among a large number of cells, thereby reducing the layout area associated with each cell. This leads to smaller chip size. Moreover, the yield of the array is significantly increased due to the drastic reduction in the total number of contacts in the array.

3 Claims, 9 Drawing Sheets

BURIED BIT-LINE SOURCE-SIDE INJECTION FLASH MEMORY CELL

BACKGROUND OF THE INVENTION

1. Field of the Invention

The present invention relates to electrically programmable read only memory (EPROM) devices and, in particular, to a flash EPROM cell that utilizes source-side injection, but which is formed to allow it to be utilized in a virtual ground buried bit-line array.

2. Discussion of the Prior Art

A. T. Wu et al., "A Novel High-Speed Five-Volt Programming EPROM Structure With Source-Side Injection", IEDM 1986, p. 584, introduced the concept of source-side injection EPROM cells. Source-side injection cells provide for improved efficiency of hot electron injection during programming. A further key feature of the Wu et al. cell is that the efficiency of hot electron injection is no longer a function of the drain junction profile, in contrast to conventional EPROM cells.

These features make the Wu et al. cell particularly suitable for use as a flash memory cell. In a "flash" EPROM, all storage registers in the memory array are electrically erased in a single operation. A flash cell requires the erasing source or drain node to have a high junction breakdown voltage, whereas the abrupt junction profile required for a conventional EPROM cell gives rise to a low junction breakdown voltage. This advantage of the Wu et al cell architecture was highlighted in U.S. Pat. No. 4,794,565, issued Dec. 27, 1988.

As described in the two above-cited Wu et al. documents, the source-side select gate of the device was a floating node. This gives rise to serious problems, since the floating node tends to become charged during cell programming, changing the device's characteristics.

K. Naruke et al., (1) "A New Flash-Erase EEPROM Cell With A Sidewall Select-Gate On Its Source Side", IEDM 1989, p. 603 and (2) European Patent Application No. 0 335 395, also disclose a flash EPROM cell based on the concept of source-side injection. The concept is much the same as that disclosed in the above-cited Wu et al. patent except that Naruke et al. specifically state that contact is made to the select gate and describe a masking technique for accomplishing this.

Figure 1A:
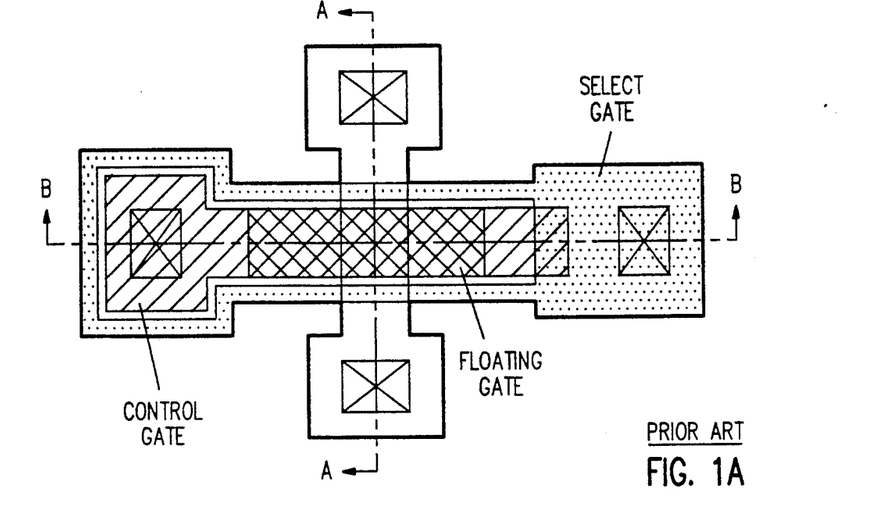
FIG. 1A is a layout of a conventional T-type EPROM cell.
Figure 1B:
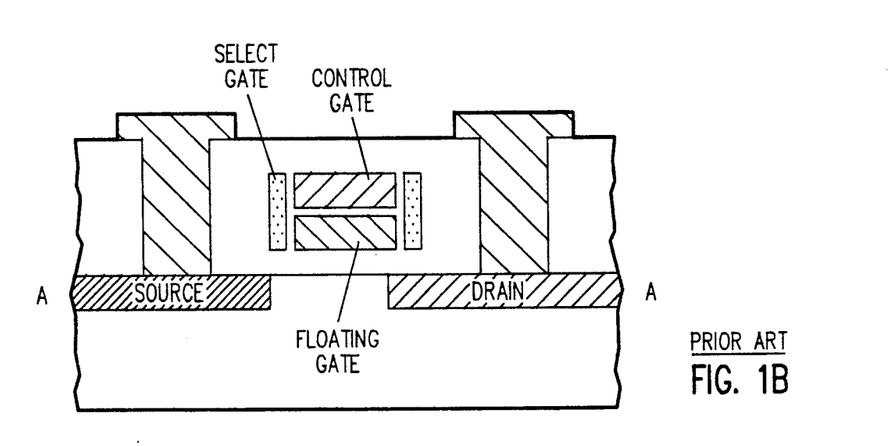
FIG. 1B is a cross-sectional view of the FIG. 1A T-type EPROM cell taken along line A—A in FIG. 1A.
Figure 1C:
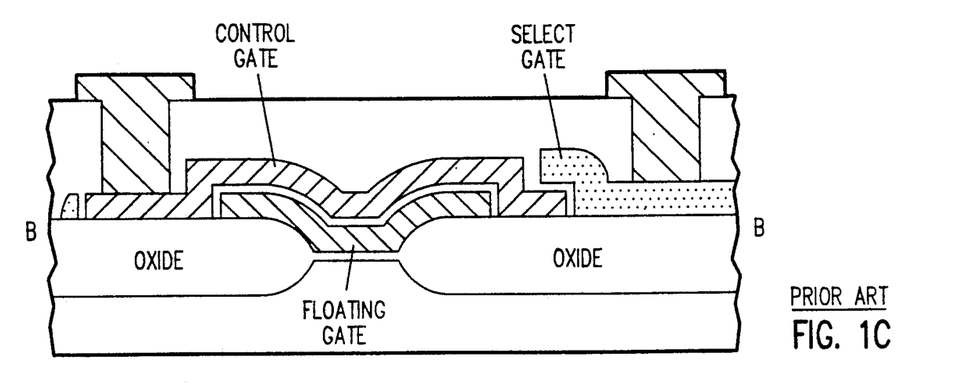
FIG. 1C is a cross-sectional view of the FIG. 1A T-type EPROM cell taken along line B—B in FIG. 1A.
Figure 2:
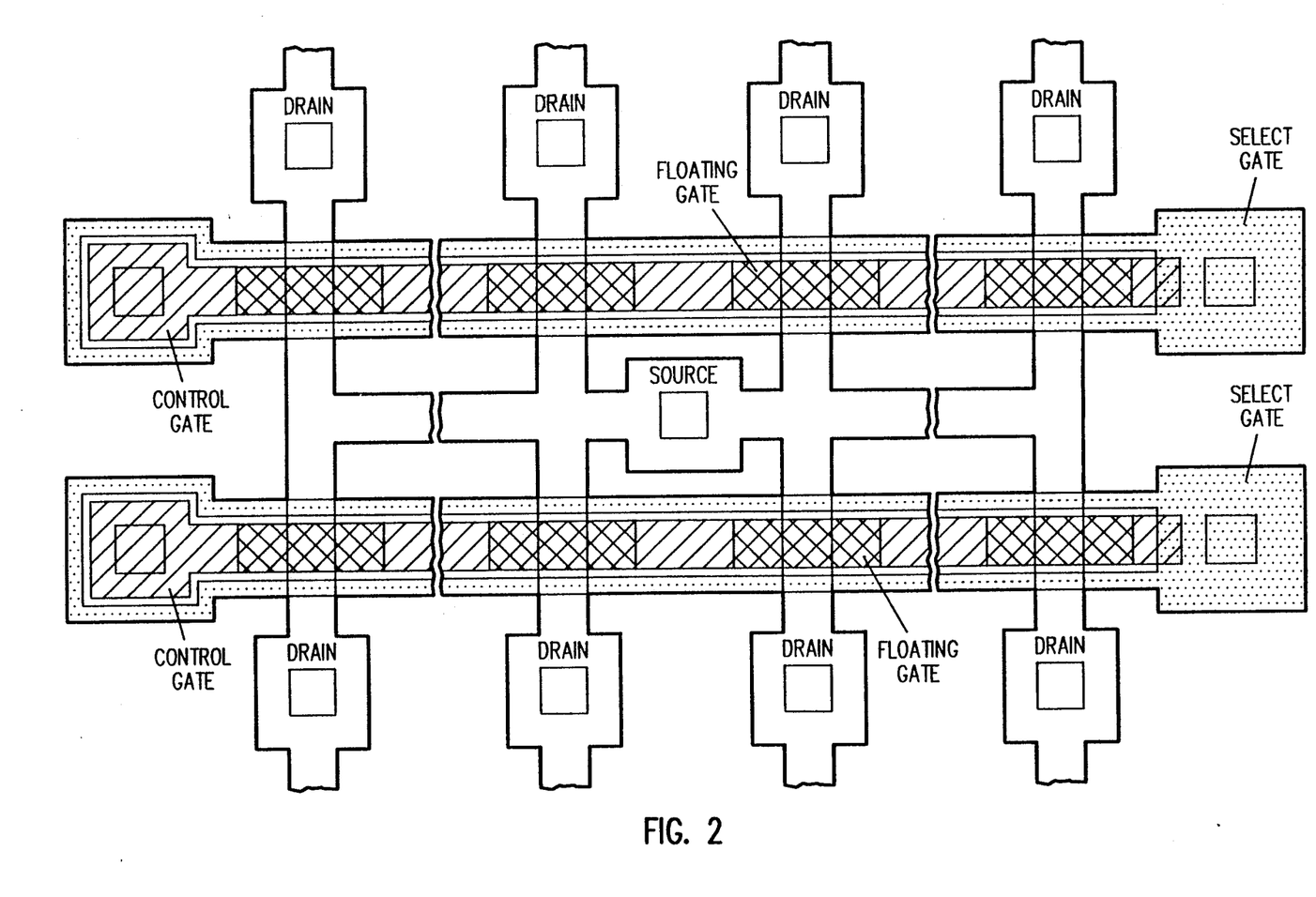
FIG. 2 is a plan view of a portion of an EPROM cell array that utilizes the T-shaped cell illustrated in FIGS. 1A-1C.

The Naruke et al. cell is shown in plan and cross-sectional view in FIGS. 1A-1C. The Naruke et al. array layout is shown in FIG. 2.

The main disadvantage of the Naruke et al. cell relates to the array layout. The above-cited Naruke et al. European patent application specifies that the select gate electrode extends in a direction perpendicular to the flow of current from source to drain. This implies that the only possible array configuration is the one shown in FIG. 2, which is commonly referred to as a "T-cell" array. This type of array is the one most commonly used for EPROM and flash memories, but has some disadvantages for very high density memories. Specifically, the T-cell array needs one contact for every two memory cells. Thus, a 16 Mbit array would require 8 million contacts. This large number of contacts creates serious yield limitations for this technology.

In addition, the Naruke et al. cell requires a narrow polysilicon spacer, which forms the select gate, to run the entire length of each word line. The difficulty of reliably forming this structure tends to further degrade the yield of the array. Moreover, the high resistance per unit length of the spacer increases the word line turn-on delay, degrading array access speed.

SUMMARY OF THE INVENTION

The present invention provides a flash EPROM cell structure that has the advantages of source-side injection, but which is formed in such a way as to allow it to be utilized in a virtual-ground buried bit-line array layout. The buried bit-line array confers two advantages over the more conventional T-cell array. It allows contacts to be shared among a large number of cells, thereby reducing the layout area associated with each cell. This leads to smaller chip size. Moreover, the yield of the array is significantly increased due to the drastic reduction in the total number of contacts in the array.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

FIGS. 3-12 illustrate a process sequence for fabricating a buried bit-line, source-side injection flash EPROM cell in accordance with the present invention.

Figure 3:
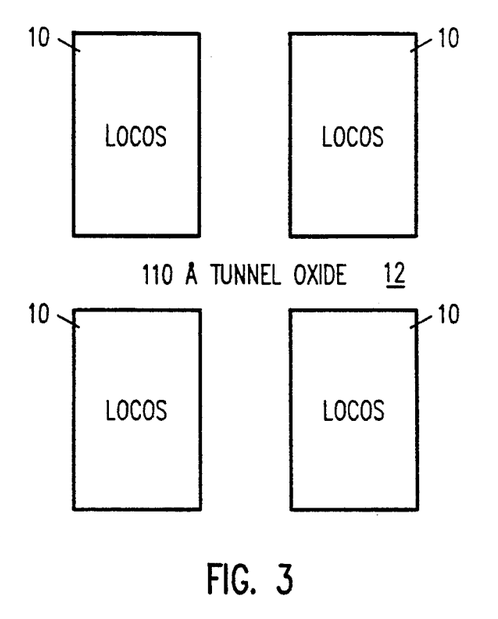
FIGS. 3-13 illustrate the sequential fabrication of a buried bit-line, source-side injection flash EPROM cell in accordance with the present invention.
Figure 4:
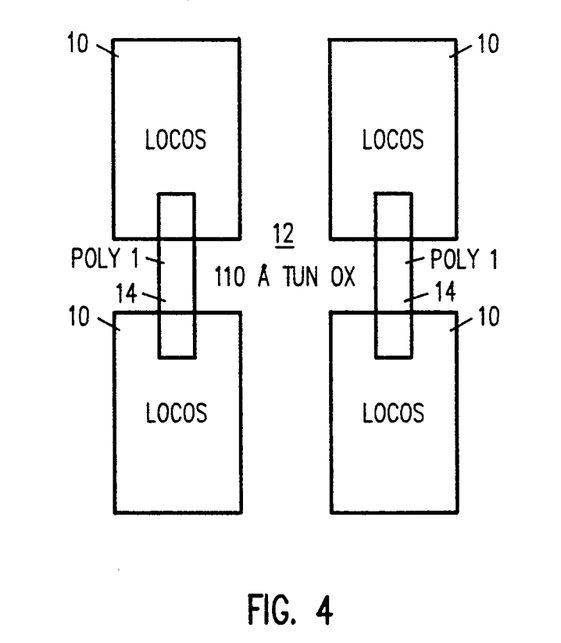

As shown in FIG. 3, at the onset of the process sequence, islands of thick field oxide 10 are formed in a silicon substrate by means of the well-known LOCOS technique. A sacrificial gate oxide is then grown on the substrate and stripped. Then a tunnel oxide 12 of around 110 Å thickness is grown. Next, a first layer of polysilicon (poly 1) is deposited to a thickness of about 4000 Å and doped to a sheet resistance of 30 Ohm/sq. using $POCl_3$. A composite oxide-nitride-oxide (ONO) layer is then formed on top of the polysilicon to a thickness of about 300 Å. The ONO/poly 1 sandwich is then masked and plasma etched to form the floating gate regions 14 shown in FIG. 4.

Figure 5:
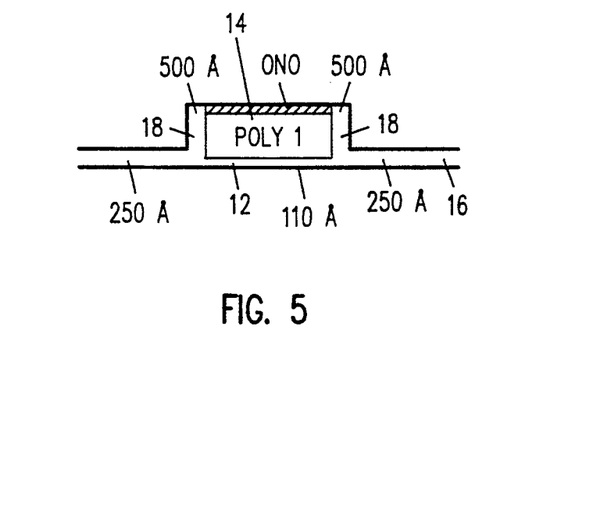
Figure 8:
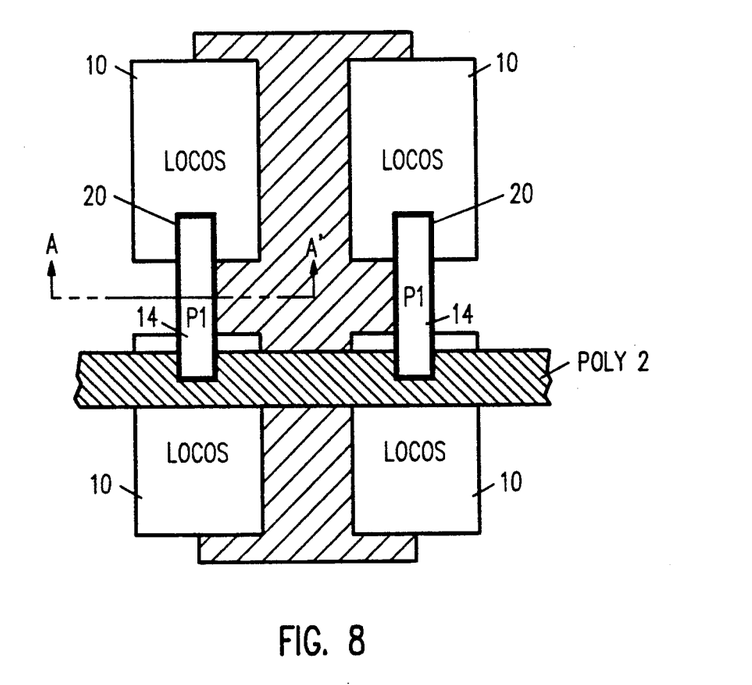
Figure 9:
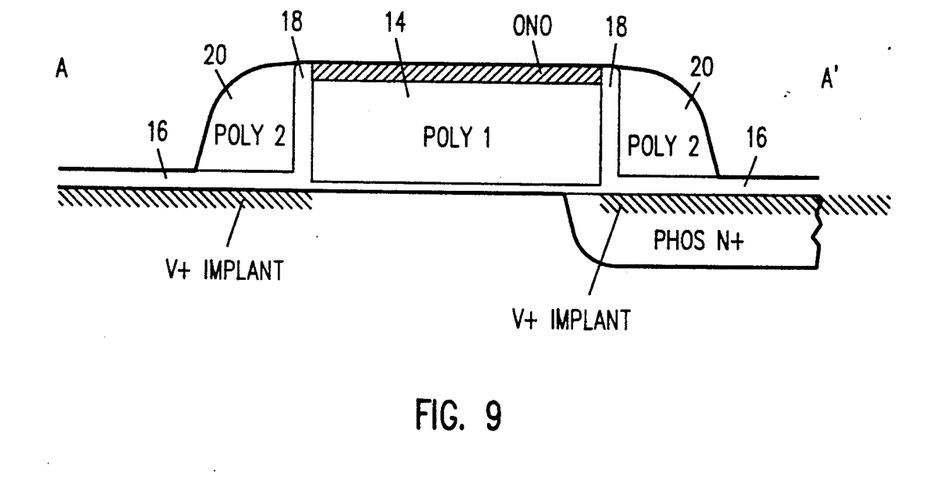

Following this plasma etch, the exposed tunnel oxide is removed by etching in buffered HF. A partial wet oxidation step is then performed to form a gate oxide 16 of around 250 Å on the silicon substrate and sealing oxide 18 of around 500 Å on the side wall of the poly 1 floating gate 14, as shown in FIG. 5. spacers 20 surrounding the floating gates 14 on the same row will be electrically connected by poly 2, as shown in FIG. 8. A cross-section taken through the active device along the line A—A in FIG. 8 is shown in FIG. 9.

Figure 10:
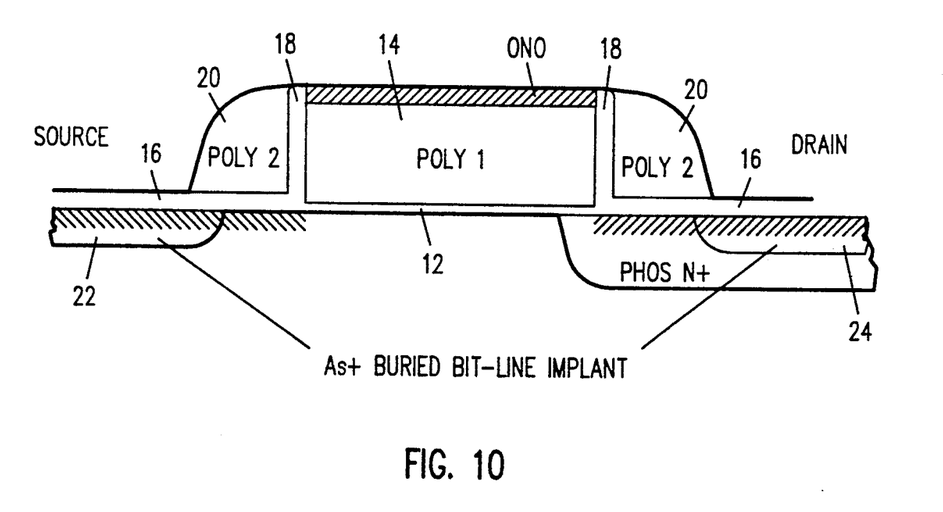

A photomask is then applied to protect the periphery of the device and an arsenic bit-line implant (for example, $1 \times 10^{15}$ cm$^{-2}$ at 60 Kev.) is performed into all of the active regions of the array not covered by either poly 1 or poly 2 to define source lines 22 and drain lines 24 of the cell. At this point in the process sequence, the cross-section of the active device is as shown in FIG. 10. Note that, due to the auto-aligning of the bit-line implant to poly 2, the poly 2 spacer 20 on the source side of the cell forms a select transistor in series with the floating gate 14. It is important to note that the width of this poly 2 spacer 20, and hence the length of the select transistor, can be very precisely controlled using existing fabrication techniques.

At this point in the process sequence, a wet oxidation step is performed to grow about 600 Å of oxide 26 on the poly 2 spacers. This oxidation simultaneously heals any etch damage in the ONO layer on top of the poly 1 floating gate 14 and increases the thickness of oxide 17 on any exposed active regions. The gate oxide 16 of the select transistor is protected from further oxidation by the spacer 20.

Figure 11:
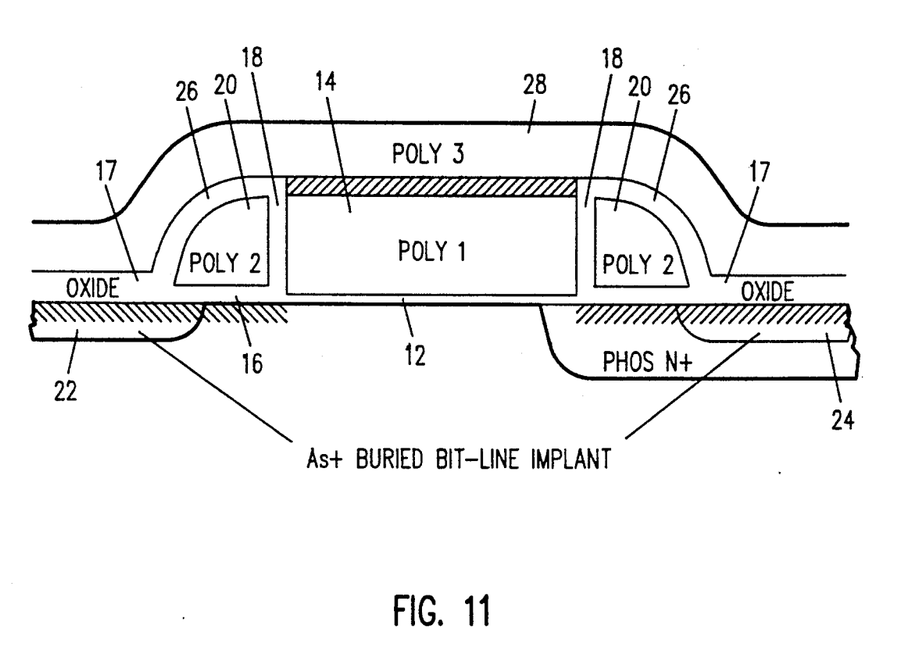
Figure 12:
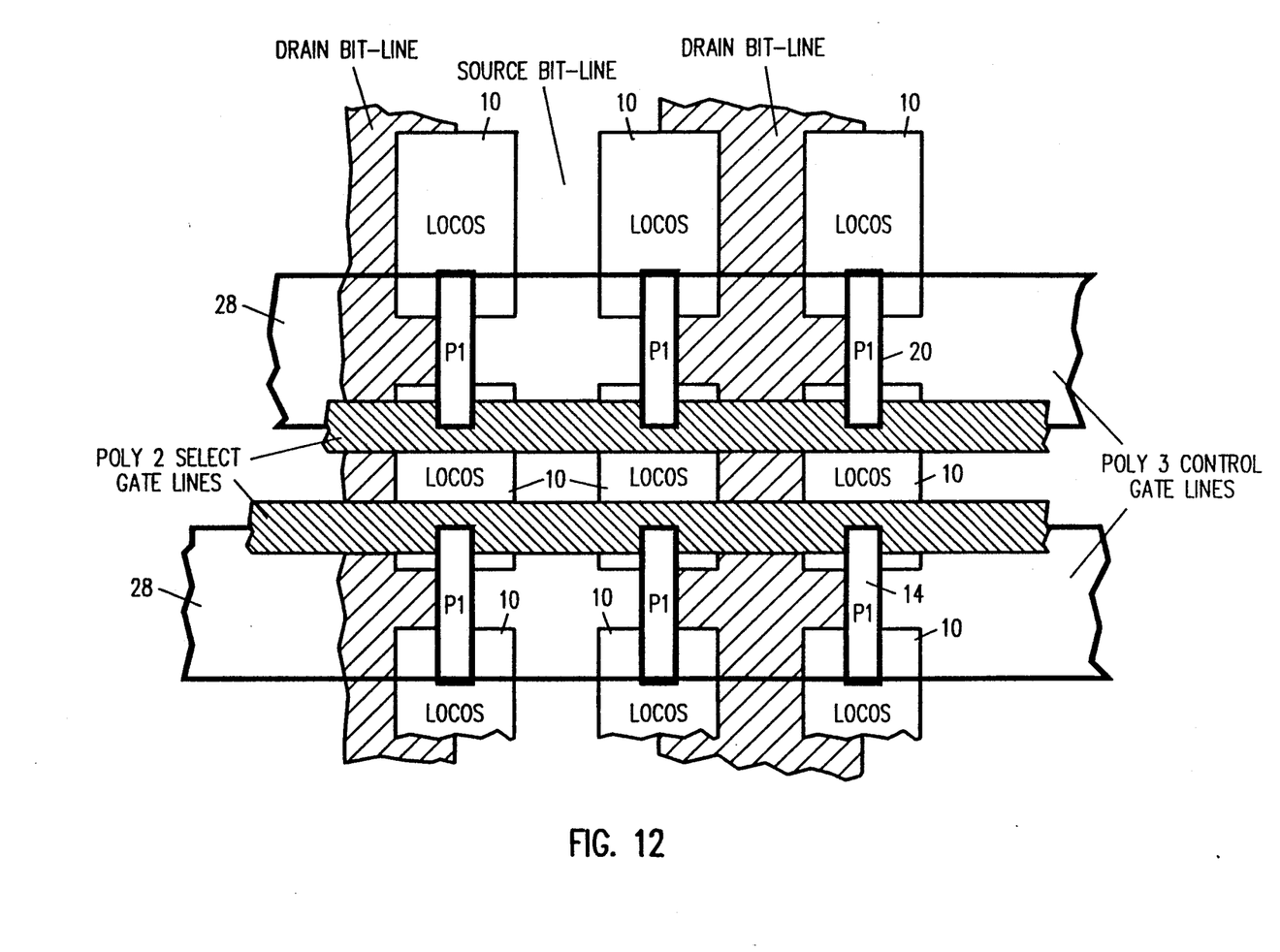

A third layer of polysilicon (poly 3) is then deposited to a thickness of 4000 Å and doped to a sheet resistance of 30 Ohm/sq. using POCl$_3$, leaving the structure shown in cross-section in FIG. 11.

A photomask is then applied to define the poly 3 control gate lines 28 and the poly 3 is plasma A boron implant (for example, $8 \times 10^{11}$ cm$^{-2}$ at 30 Kev) is then performed to fix the threshold voltage $V_t$ of the select transistor. This implant is performed throughout the memory array, but may be masked out of the periphery of the circuit. A memory cell drain implant mask is then defined to selectively open up the active region adjacent to the drain side of each poly 1 floating gate 14, while protecting other active regions. A masked phosphorous implant (for example, $1 \times 10^{14}$ cm$^{-2}$ at 80 Kev.) is then performed creating the structure shown in FIG. 6. The phosphorous implant provides a high breakdown voltage for the drain node, which is needed during cell erasure.

This implant mask is designed so that the phosphorous-doped drain regions of adjacent cells are grouped together to form a common bit line node. Similarly, the source bit lines of adjacent cells are also grouped together so that the source/drain orientation of the cells alternates across the array. The need for this array layout is discussed in greater detail below in conjunction with a discussion of the erase bias scheme.

Figure 7:
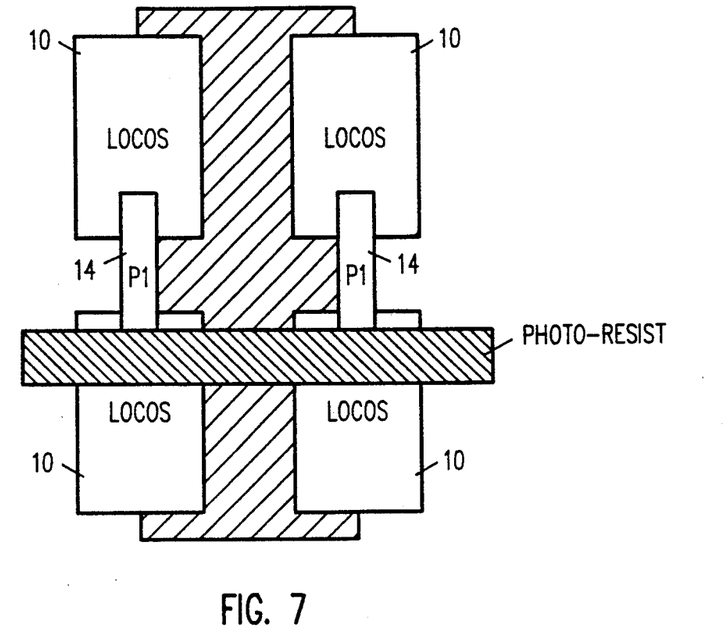

A second layer of polysilicon (poly 2) is deposited to a thickness of 4000 Å and doped to a sheet resistance of 30 Ohm/sq. using POCl$_3$. A select gate mask is then applied, as shown in FIG. 7, to form lines of resist running perpendicular to the poly 1 floating gate 14 and intersecting one end of each floating gate 14.

An anisotropic plasma etch of the poly 2 layer is then performed. The etch is timed to leave a well-defined spacer 20 of poly 2 around the perimeter of each poly 1 floating gate 14. However, due to the presence of the select gate resist, all of the poly 2 etched, using the oxide layers on top of the poly 1, poly 2 and active regions as an etch stop. This results in the final device structure shown in plan view in FIG. 12.

From this stage of the process sequence, a conventional series of CMOS process steps is used to create the N+ and P+ regions required for the peripheral transistors and the contact, via and metal patterns. The poly 3 layer could conveniently be used to form the gate electrodes of the transistors used in the periphery of the circuit.

The operation of the cell formed in accordance with the above-described process sequence will now be described.

The bias voltages to be applied to the terminals of the cell are shown in Table 1. These figures are only approximate and will vary according to the electrical parameters of the device.

TABLE 1

| CELL NODE OPERATING MODE | Source | Control Gate | Select Gate | Drain |
|---|---|---|---|---|
| READ | 0 Volt | 5 Volt | 5 Volt | 1.5 Volt |
| WRITE | 0 Volt | 12.5 Volt | 1.5 Volt | 5.0 Volt |
| ERASE | Floating | 0 Volt | 0 Volt | 12.5 Volt |

In the read mode, both the select gate and the control gate are held at 5 volts. If the cell has not been programmed to a high threshold voltage $V_t$, then channel current will flow.

In the program mode, the control gate is held to a high potential and the select gate is held at a potential just above the threshold voltage $V_t$ of the select transistor. This is the optimum condition for hot electron injection into the floating gate 14 due to the high lateral field generated in the weak gate-controlled region between the select and floating gates.

Figure 6:
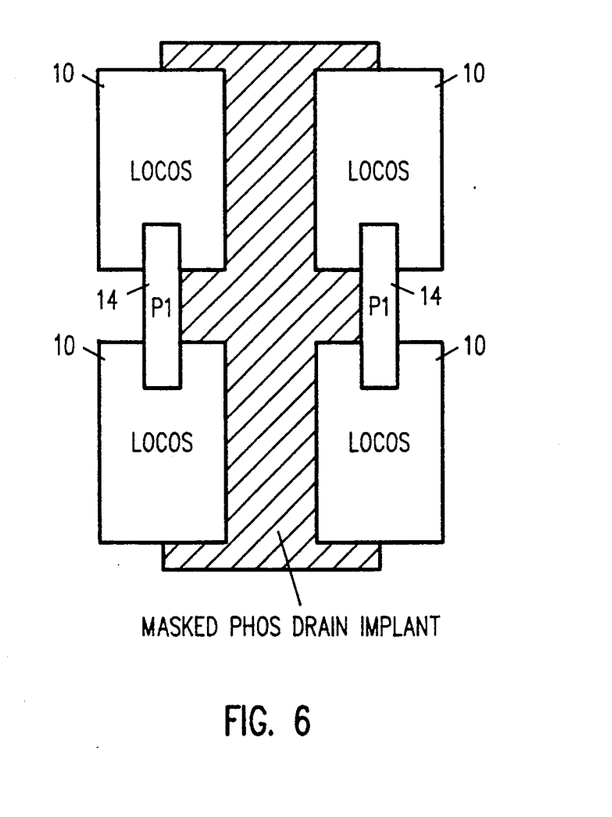

During the erase mode, the drain 24 is held to a high voltage in order to tunnel electrons off the floating gate 14 and reduce the cell's threshold voltage $V_t$. The select and control gates are held at ground to maximize the field across the tunnel oxide 12 and the source 22 is allowed to float. In general, all drain bit-lines will be pulled to high voltage during erase, since this is a block ("flash") operation. The need to pull all of the drain nodes in the array to a high voltage, while allowing the source nodes to float, leads to the requirement of grouping together the drain nodes of adjacent array cells, as shown in FIG. 6.

Referring back to FIG. 12, it can be seen that the poly 2 select gate and the poly 3 control gate associated with each row of the array run in close proximity to one another. This could potentially give rise to difficulty in the case where it is desireable to make low impedance connection to both of these lines in order to reduce row RC delay for a fast read access time.

Figure 13:
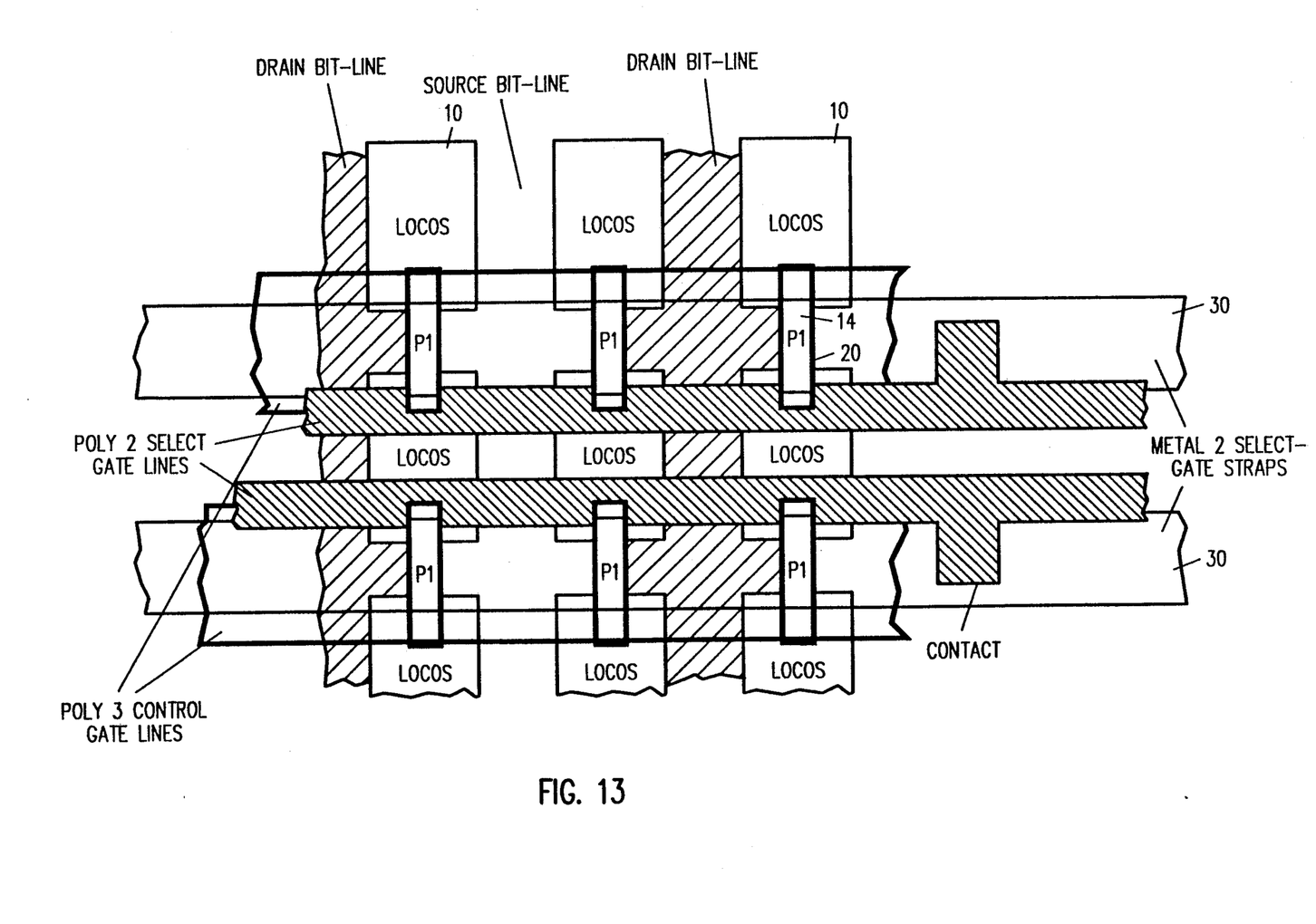

Two alternative solutions are proposed. In the first approach, the third layer of polysilicon (poly 3) can be silicided, using conventional processing techniques, in order to significantly reduce its sheet resistance. Since the poly 3 control gate 28 is the wider of the two lines running the X direction, the resistance per unit length of this electrode will be quite low. The sheet resistance associated with the poly 2 select gate could then be effectively reduced by running a second layer of metal 30 substantially over the top of each select line and tying it to the select line every 16 cells, for example. An example of such a connection is shown in FIG. 13. It is assumed that stripes of the first layer of metal would run in the Y direction in the array and be used to make the bit-lines.

A second approach makes use of one of the features of the above-described cell: the built-in select gate. As shown in Table 1 above, both the select and control gates of the selected row will be held at 5 volts in the read mode. The most obvious bias condition for unselected rows would be for both the select and control gate lines in these rows to be held at ground. Due to the series connection of the select and floating gate transistors, it would be possible, however, to hold the control gates of all unselected rows at 5 volts, if the associated select lines were held to ground. The grounded-gate select transistors would insure that the cells on the unselected rows would draw no current. This, then, opens up the possibility that all control gate lines in the array could be held at 5 volts DC during read mode, and only the select gate lines would need to be switched in order to select the appropriate row. In this case, the series resistance of the select gate lines alone would determine the RC delay associated with the read operation.

Using this mode of operation, it would be necessary to lower the select line impedance by strapping it with metal, as described above. No steps would be needed to reduce the resistance associated with the control gate. It should be noted that both program and erase are inherently slow operations, and so delays associated with switching the control gate would be of no consequence.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method of fabricating a buried bit line, source-side injection flash EPROM cell array in a substrate of semiconductor material, the flash EPROM cell array defined by a matrix of a plurality of rows of flash EPROM cells extending in the X direction and a plurality of flash columns of EPROM cells extending in the Y direction, the fabrication method comprising the steps of:

forming an array of field oxide isolation regions in a surface of the semiconductor substrate to define active device regions in the substrate;

forming a layer of first dielectric material having a first thickness on the exposed surface of the active device regions;

forming a layer of first conductive material on the layer of first dielectric material;

forming a layer of second dielectric material on the layer of first conductive material;

etching the layer of second dielectric material and underlying layer of first conductive material to define floating gate electrodes of first conductive material that have second dielectric material formed thereon and that are separated from the semiconductor substrate by underlying first dielectric material, each floating gate electrode extending in the Y direction and terminating at its first and second ends on first and second field oxide isolation regions, respectively, and each floating gate electrode having a drain side and a source side;

removing first dielectric material not underlying the floating gate electrodes to expose regions of the semiconductor substrate;

simultaneously forming gate dielectric material having a second thickness on the exposed regions of the semiconductor substrate and sidewall dielectric material on the sidewalls of the floating gate electrodes;

introducing dopant of a conductivity type opposite the conductivity of the semiconductor substrate into the semiconductor substrate adjacent the drain side of each floating gate electrode to form buried bit lines in the Y direction in the EPROM array matrix;

for each row of flash EPROM cells in the flash EPROM array matrix, forming an EPROM cell spacer of second conductive material adjacent to the floating gate electrode of each flash EPROM cell in said row but separated from said floating gate electrode by the sidewall dielectric material formed on the sidewall of said floating gate electrode, and simultaneously forming a select gate line of second conductive material and running in the X direction and substantially parallel to the flow of current from the source to the drain of each flash EPROM cell in said row, said select gate line being in electrical contact with each EPROM cell spacer in said row;

introducing dopant into the semiconductor substrate adjacent both the drain side and the source side of each floating gate electrode to define source and drain regions of the EPROM cells;

forming control gate dielectric material over the floating gate electrodes and the EPROM cell spacers; and for each row of flash EPROM cell in the flash EPROM array matrix, forming a control gate line of third conductive material running in the X direction and overlying the floating gate electrodes and the EPROM cell spacers in said row and separated therefrom by the control gate dielectric material.

2. A method of fabricating a buried bit line, source-side injection flash EPROM cell array in a P-type silicon substrate, the flash EPROM cell array defined by a matrix of a plurality of rows of flash EPROM cells extending in the X direction and a plurality of columns of flash EPROM cells extending in the Y direction, the fabrication method comprising the steps of:

forming an array of field oxide isolation regions in a surface of the P-type silicon substrate to define active device regions in the substrate;

forming a layer of tunnel oxide having a first thickness on the exposed surface of the active device regions;

forming a layer of first polysilicon (poly1) on the layer of tunnel oxide;

forming a layer of oxide-nitride-oxide (ONO) on the layer of poly1;

etching the ONO layer and the underlying poly1 layer to define poly1 floating gate electrodes that have ONO formed thereon and that are separated from the silicon substrate by underlying tunnel oxide, each poly1 floating gate electrode extending in the Y direction and terminating at its first and second ends on first and second field oxide isolation regions, respectively, each poly1 floating gate electrode having a drain side and a source side;

removing tunnel oxide not underlying the poly1 floating gate electrodes to expose regions of the silicon substrate;

simultaneously forming gate oxide having a second thickness on the exposed regions of the semiconductor substrate and sidewall oxide on the sidewalls of the poly1 floating gate electrodes;

introducing N-type dopant into the semiconductor substrate adjacent the drain side of each poly1 floating gate electrode to form N-type buried bit lines running in the Y direction in the EPROM array matrix;

for each row of flash EPROM cells in the flash EPROM array matrix, forming a polysilicon spacer adjacent to the poly1 floating gate electrode of each EPROM cell in said row but separated from said poly1 floating gate electrode by the sidewall oxide formed on the sidewall of the poly1 floating gate electrode, and simultaneously forming a polysilicon select gate line running in the X direction substantially parallel to the flow of current from the source to the drain of each flash EPROM cell in said row, said polysilicon select gate line being in electrical contact with each polysilicon spacer in said row;

introducing N-type dopant into the semiconductor substrate adjacent to both the drain side and the source side of each floating gate electrode to define source and drain regions of the EPROM cells;

forming control gate oxide over the poly1 floating gate electrodes and over the EPROM cell spacers;

and for each row of flash EPROM cells in the flash EPROM array matrix forming a polysilicon control gate line running in the X direction and overlying the poly1 floating gate electrodes and the polysilicon spacers in said row and separated therefrom by the control gate oxide.

3. A method as in claim 2 wherein the polysilicon control gate comprises silicided polysilicon and further including, for each polysilicon select line, a metal line running substantially parallel to and overlying the polysilicon select line and having a contact formed between said metal line and said polysilicon select line every N cells in said row, where N is an integer.

* * * * *

UNITED STATES PATENT AND TRADEMARK OFFICE
CERTIFICATE OF CORRECTION

PATENT NO. : 5,284,784
DATED : February 8, 1994
INVENTOR(S) : MARTIN H. MANLEY

It is certified that error appears in the above-indentified patent and that said Letters Patent is hereby corrected as shown below:

<u>In the claims:</u>

In Col. 5, line 33, delete "flash columns" and replace with --columns--.

In Col. 5, line 33, before "EPROM" insert --flash--.

In Col. 5, line 66, after "conductivity" insert --type--.

In Col. 8, line 2, before "EPROM" insert --flash--.

In Col. 8, line 4, delete "EPROM cell" and replace with --polysilicon--.

In Col. 8, line 17, after "N" insert --flash EPROM--.

Signed and Sealed this

Sixth Day of September, 1994

Attest:

BRUCE LEHMAN

*Attesting Officer*     *Commissioner of Patents and Trademarks*